United States Patent [19]

Lo

[11] Patent Number: 5,838,143
[45] Date of Patent: Nov. 17, 1998

[54] AUTOMATIC BATTERY POLARITY IDENTIFICATION CIRCUIT HAVING ELECTRODE PLATES, CAPACITOR AND RELAYS

[76] Inventor: Te-Yu Lo, 8F, No. 45, Pao Chung Rd., Hsin Tien, Taipei Hsien, Taiwan

[21] Appl. No.: 901,793

[22] Filed: Jul. 28, 1997

[30] Foreign Application Priority Data

Oct. 8, 1996 [TW] Taiwan ............................ 84217398A01

[51] Int. Cl.⁶ .................................................. H01M 10/46
[52] U.S. Cl. .............................................................. 320/16 J
[58] Field of Search .................................... 320/103, 104, 320/105, 106, 112, 114, 165, DIG. 15, 101, 107

[56] References Cited

U.S. PATENT DOCUMENTS

| | | | |
|---|---|---|---|
| 4,855,662 | 8/1989 | Yang | 320/103 |
| 4,871,957 | 10/1989 | Taranto et al. | 320/105 |
| 4,994,727 | 2/1991 | Yang | 320/105 |

*Primary Examiner*—Edward Tso
*Attorney, Agent, or Firm*—Jacobson, Price, Holman & Stern, PLLC

[57] ABSTRACT

An automatic battery polarity identification circuit having a first electrode plate and a second electrode plate adapted for receiving two opposite ends of a battery; a capacitor having a first end and a second end; and at least one relay, each of the at least one relay having a coil, the coil having a first end connected to the first end of the capacitor and a second end, a second fixed contact and a third fixed contact connected between the first electrode plate and the second end of the coil, a first fixed contact and a fourth fixed contact connected to the second electrode.

3 Claims, 6 Drawing Sheets

AUTOMATIC BATTERY POLARITY IDENTIFICATION CIRCUIT HAVING ELECTRODE PLATES, CAPACITOR AND RELAYS

BACKGROUND OF THE INVENTION

The present invention relates to an automatic battery polarity identification circuit which keeps the polarity of its output potential unchanged when the battery is inserted in the battery chamber in the reversed direction, and more particularly to such an automatic battery polarity identification circuit which has a simple structure that consumes less electric energy, and is easy and inexpensive to manufacture.

FIG. 1 shows an automatic battery polarity identification circuit according to the prior art, which comprises a relay 9, a PCP transistor Q1, a NPN transistor Q2, resistors R1;R2, and capacitors C1;C2. The polarity of the output voltage of this automatic battery polarity identification circuit remain unchanged when the user changes the direction of the battery in the battery chamber 90. However, this automatic battery polarity identification circuit is not satisfactory in function because the relay 9 causes a current loss of about 80 $\mu$A~280 $\mu$A when the battery is connected.

SUMMARY OF THE INVENTION

The present invention provides an automatic battery polarity identification circuit which eliminates the aforesaid problem. According to the preferred embodiment of the present invention, the automatic battery polarity identification circuit comprises a first electrode plate and a second electrode plate adapted for receiving two opposite ends of a battery; a capacitor having a first end and a second end; and at least one relay, each of the at least one relay having a coil, the coil having a first end connected to the first end of the capacitor and a second end, a second fixed contact and a third fixed contact connected between the first electrode plate and the second end of the coil, a first fixed contact and a fourth fixed contact connected to the second electrode.

DETAILED DESCRIPTION OF THE PREFERRED EMBODIMENT

Figure 1:
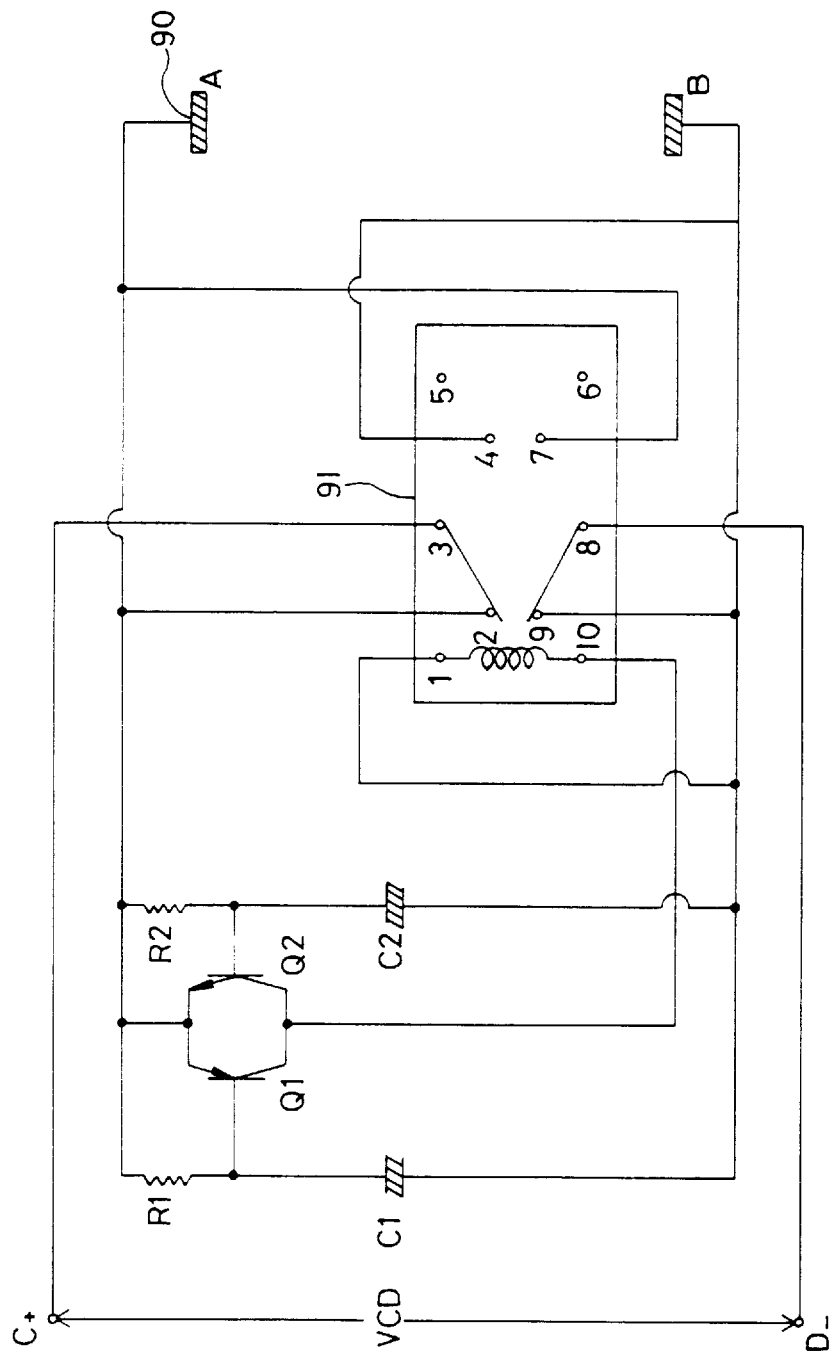
FIG. 1 is a circuit diagram of an automatic battery polarity identification circuit according to the prior art.
Figure 2:
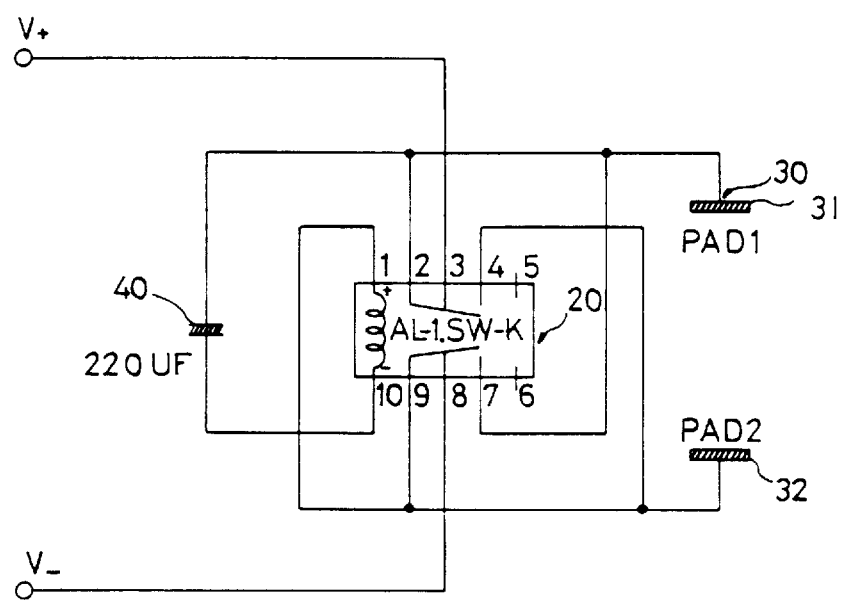
FIG. 2 is a circuit diagram of an automatic battery polarity identification circuit according to the present invention.

Referring to FIG. 2, an automatic battery polarity identification circuit in accordance with the present invention comprises a relay 20 (it can be for example a latch type relay), a battery chamber 30 having a first electrode plate 31 and a second electrode plate 32, and a capacitor 40.

The relay 20 has a first coil contact 1 and a third fixed contact 9 connected to the second electrode plate 32, a second coil contact 10 connected to one end of the capacitor 40, a first fixed contact 2 and a fourth fixed contact 7 connected between an opposite end of the capacitor 40 and the first electrode plate 31, a first movable contact 3 connected to a positive power output terminal, a second movable contact 8 connected to a negative power output terminal, and a second fixed contact 4 connected to the second electrode plate 32.

Figure 3:
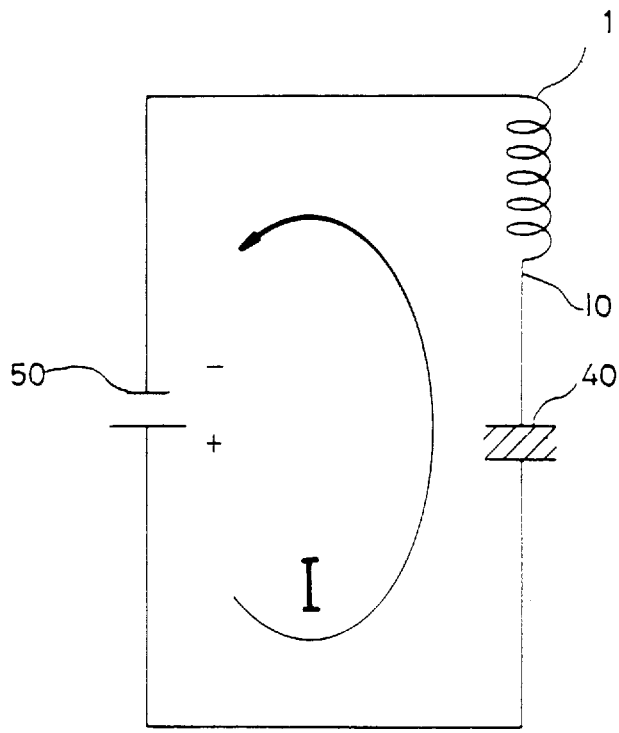
FIG. 3 is a charging circuit diagram showing the battery installed in the battery chamber in one direction and charged according to the present invention.
Figure 4:
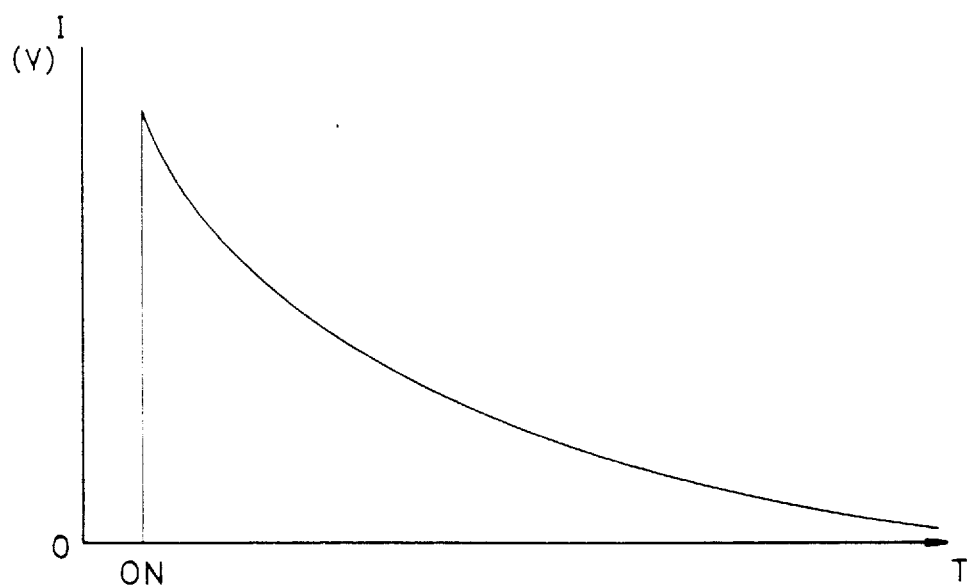
FIG. 4 is a charging current curve according to the present invention.

Referring to FIGS. 3 and 4, when the battery 50 is mounted in the battery chamber 30 with its positive terminal and negative terminal respectively disposed in contact with the first electrode plate 31 and the second electrode plate 32, the two opposite ends of the coil of the relay 20 are energized by negative potential, the first movable contact 3 and first fixed contact 2 of the relay 20 are electrically connected, and the second movable contact 8 and third fixed contact 9 of the relay 20 are electrically connected, and at the same time, the first movable contact 3 and second fixed contact 4 of the relay 20 are electrically disconnected, the second movable contact 8 and fourth fixed contact 7 are electrically disconnected, therefore the negative terminal of the battery 50 is electrically connected to the first coil contact 1 of the relay 20 and one end of the capacitor 40 is electrically connected to the positive terminal of the battery 50 (see FIG. 3). When the negative terminal of the battery 50 is electrically connected to the first coil contact 1 of the relay 20 and the capacitor 40 is electrically connected to the positive terminal of the battery 50, a charging current I is produced to charge the capacitor 40 (the variation of the charging current I after charging is shown in FIG. 3). When the voltage at both ends of the capacitor 40 reaches the voltage level of the battery 50, the circuit stops from charging the capacitor 40 (the value of the charging current is turned to zero), and the voltage value at the two opposite ends of the capacitor 40 keeps the coil of the relay 20 maintained energized by negative potential, therefore the first movable contact 3 and first fixed contact 2 of the relay 20 are maintained in the normal close status, the second movable contact 8 and third fixed contact 9 of the relay 20 are maintained in the normal close status. Under this stage, the current leakage value of the capacitor 40 is at about 1 $\mu$A. Only about 1 V is sufficient to keep the relay 20 work properly. The relay 20 works within about 3~4 ms after the supply of the necessary working voltage to the two opposite ends of the coil of the relay 20.

On the contrary, when the battery 50 is mounted in the battery chamber 30 with its negative terminal and positive terminal respectively disposed in contact with the first electrode plate 31 and the second electrode plate 32, the two opposite coil contacts 1;10 of the relay 20 are energized by positive potential, the first movable contact 3 and first fixed contact 2 of the relay 20 are electrically disconnected, and the second movable contact 8 and third fixed contact 9 of the relay 20 are electrically disconnected, and at the same time, the first movable contact 3 and second fixed contact 4 of the relay 20 are electrically connected, the second movable contact 8 and fourth fixed contact 7 are electrically connected.

Figure 5:
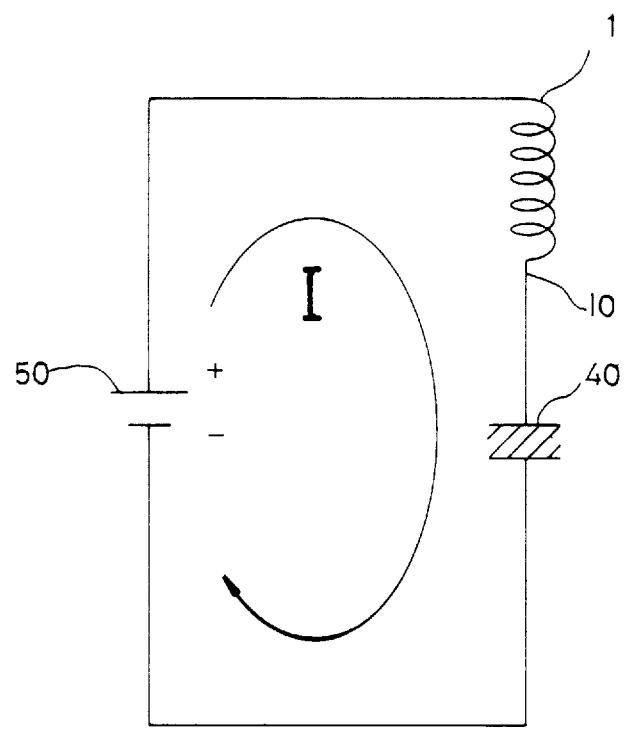
FIG. 5 is a charging circuit diagram showing the battery installed in the battery chamber in the reversed direction and charged according to the present invention.

When the positive terminal and negative terminal of the battery 50 are respectively disposed in contact with the second electrode plate 32 and the first electrode plate 31, the first movable contact 3 and first fixed contact 2 of the relay 20 are electrically disconnected, the second movable contact 8 and third fixed contact 9 of the relay 20 are electrically disconnected, at the same time the first movable contact 3 and second fixed contact 4 of the relay 20 are electrically connected, the second movable contact 8 and fourth fixed contact 7 of the relay 20 are electrically connected (see FIG. 5). Under this state, the positive terminal of the battery 50 is electrically connected to the first coil contact 1 of the relay 20 and one end of the capacitor 40 is connected to the negative terminal of the battery 50, therefore an electric current I is produced to charge the capacitor 40. When the voltage at the two opposite ends of the capacitor 40 reaches the voltage level of the battery 50, the circuit stops from charging the capacitor 40. Because the capacitor 40 has a potential difference, the first movable contact 3 and first fixed contact 2 of the relay 20 are maintained electrically disconnected, the second movable contact 8 and third fixed contact 9 of the relay 20 are maintained electrically disconnected. Therefore, the polarity of the output voltage of the circuit remains unchanged.

Figure 6:
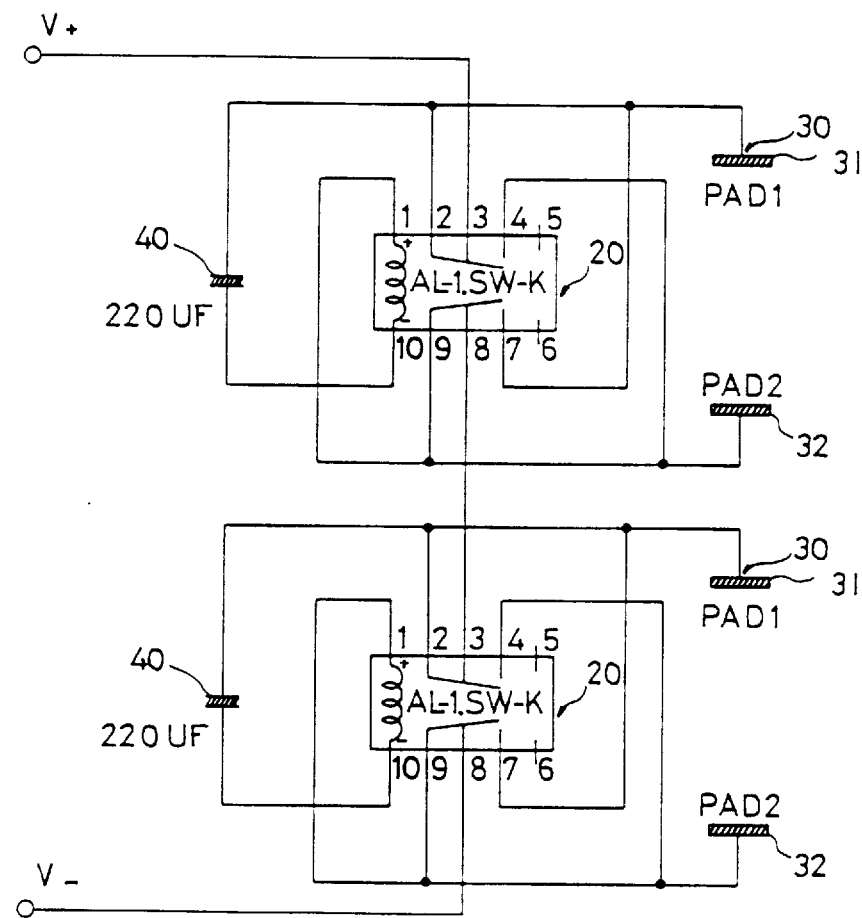
FIG. 6 is a circuit diagram showing two automatic battery polarity identification circuits connected in series according to the present invention.
Figure 7:
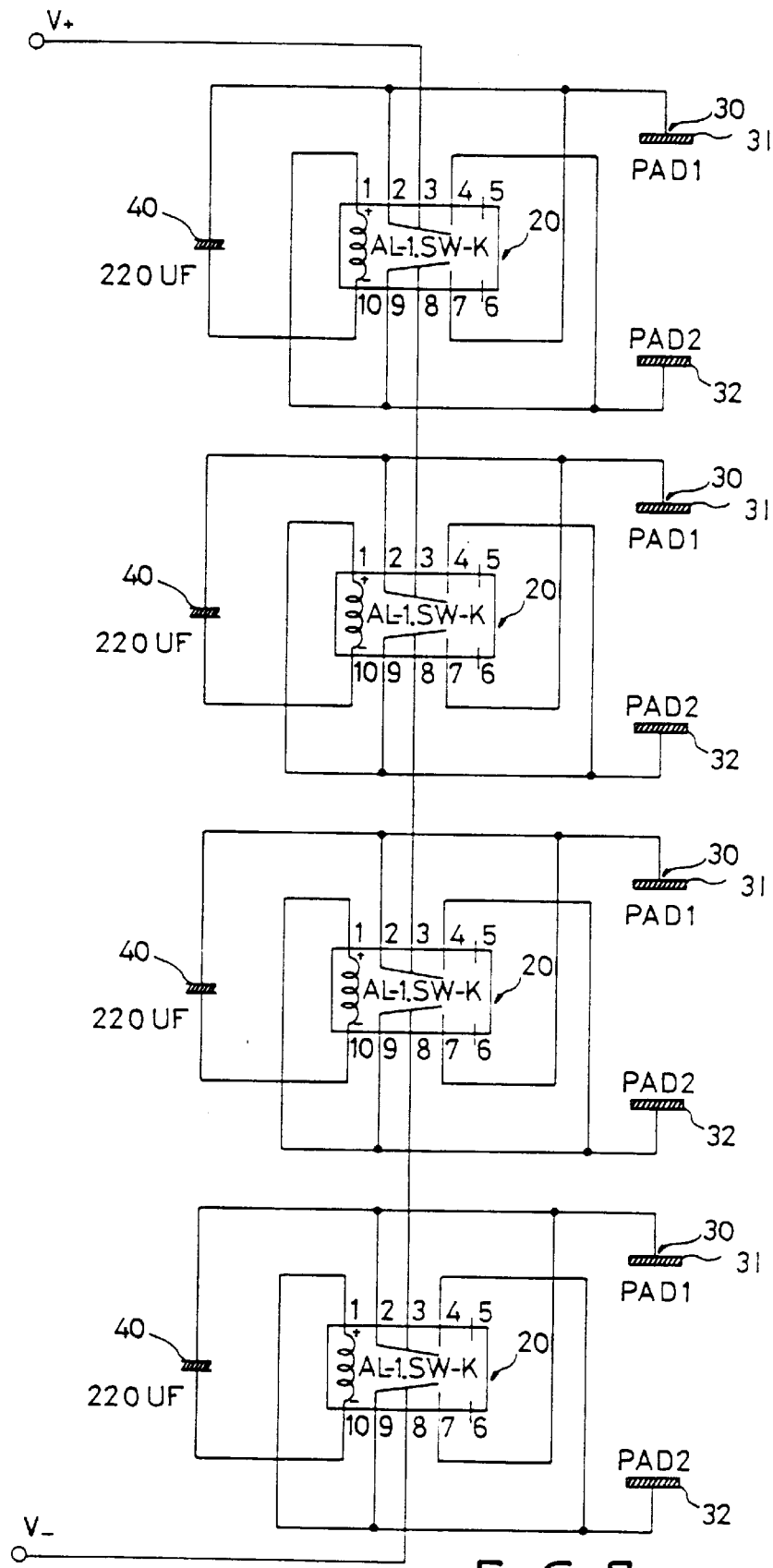
FIG. 7 is a circuit diagram showing three automatic battery polarity identification circuits connected in series according to the present invention.

Referring to FIGS. 6 and 7, two or more automatic battery polarity identification circuits may be connected in series. When two or more automatic battery polarity identification circuits are connected in series, each two adjacent relays 20 are electrically connected in series by movable contacts; one movable contact of the relay 20 of the first automatic battery polarity identification circuit is connected to a positive voltage output terminal, one movable contact of the relay 20 of the last automatic battery polarity identification circuit is connected to a negative voltage output terminal.

It is to be understood that the drawings are designed for purposes of illustration only, and are not intended as a definition of the limits and scope of the invention disclosed.

What the invention claimed is:

1. An automatic battery polarity identification circuit comprising:

a first electrode plate and a second electrode plate adapted for receiving two opposite ends of a battery;

a capacitor having a first end and a second end; and at least one relay, each of said at least one relay having a coil, said coil having a first end connected to the first end of said capacitor and a second end, a second fixed contact and a third fixed contact connected between said first electrode plate and the second end of said coil, a first fixed contact and a fourth fixed contact connected to said second electrode.

2. The automatic battery polarity identification circuit of claim 1, wherein said at least one relay includes a plurality of relays connected into a series circuit by movable contacts, said series circuit including a first relay having a movable contact connected to a positive power output terminal and a last relay having a movable contact connected to a negative power output terminal.

3. The automatic battery polarity identification circuit of claim 1, wherein each of said at least one relay is a latch type relay.

* * * * *